United States Patent
Ishikawa et al.

(10) Patent No.: US 6,517,420 B2
(45) Date of Patent: Feb. 11, 2003

(54) WAFER SURFACE MACHINING APPARATUS

(75) Inventors: Toshihiko Ishikawa, Mitaka (JP); Yasushi Katagiri, Mitaka (JP)

(73) Assignee: Tokyo Seimitsu Co., Ltd., Mitaka (JP)

( * ) Notice: Subject to any disclaimer, the term of this patent is extended or adjusted under 35 U.S.C. 154(b) by 0 days.

(21) Appl. No.: 09/863,362

(22) Filed: May 24, 2001

(65) Prior Publication Data

US 2001/0024936 A1 Sep. 27, 2001

Related U.S. Application Data

(62) Division of application No. 09/298,998, filed on Apr. 26, 1999, now Pat. No. 6,257,966.

(30) Foreign Application Priority Data

| Apr. 27, 1998 | (JP) | 10-117333 |
| Apr. 27, 1998 | (JP) | 10-117337 |
| Jan. 6, 1999 | (JP) | 11-1318 |
| Jan. 8, 1999 | (JP) | 11-3251 |

(51) Int. Cl.[7] .................................................. B24B 7/22
(52) U.S. Cl. ........................ 451/67; 451/279; 451/289; 451/339
(58) Field of Search ............................ 451/67, 41, 279, 451/289, 339, 388; 15/17, 21.1, 88.3, 88.4; 134/902; 296/21, 75, 181

(56) References Cited

U.S. PATENT DOCUMENTS

| 4,141,180 A | | 2/1979 | Gill, Jr. et al. |
| 4,476,601 A | | 10/1984 | Oka |
| 4,638,601 A | | 1/1987 | Steere et al. |
| 4,680,893 A | | 7/1987 | Cronkhite et al. |
| 4,753,049 A | * | 6/1988 | Mori ............................ 198/394 |
| 5,329,733 A | | 7/1994 | Steere, Jr. |
| 5,395,098 A | * | 3/1995 | Eickhorst et al. ............. 269/21 |
| 5,421,595 A | | 6/1995 | Cripe et al. |
| 5,465,447 A | | 11/1995 | Itoh et al. |
| 5,542,874 A | * | 8/1996 | Chikaki ........................ 451/158 |
| 5,616,212 A | | 4/1997 | Isobe |
| 5,649,854 A | | 7/1997 | Gill, Jr. |
| 5,674,115 A | * | 10/1997 | Yamashita et al. ........... 451/285 |
| 5,679,060 A | | 10/1997 | Leonard et al. |
| 5,871,393 A | * | 2/1999 | Shiozawa .................... 451/285 |
| 5,902,173 A | | 5/1999 | Tanaka |
| 5,938,512 A | | 8/1999 | Takei et al. |
| 5,944,588 A | | 8/1999 | Marmillion et al. |
| 6,074,288 A | | 6/2000 | Nagahara et al. |

FOREIGN PATENT DOCUMENTS

| EP | 0 547 894 | 6/1993 |
| EP | 0 655 772 | 5/1995 |
| JP | 63-106139 | 7/1988 |
| JP | 1-40727 | 6/1989 |
| JP | 2-131892 | 5/1990 |
| JP | 8-39407 | 2/1993 |
| JP | 6-8086 | 1/1994 |
| JP | 8-55896 | 2/1996 |
| JP | 8-148450 | 6/1996 |

* cited by examiner

Primary Examiner—Joseph J. Hail, III
Assistant Examiner—Anthony Ojini
(74) Attorney, Agent, or Firm—Nixon Peabody LLP; David S. Safran

(57) ABSTRACT

A surface machining apparatus comprises a suction transfer device that is capable of transferring a ground thin wafer held thereon without damaging it. After the wafer is ground at two different grinding stages, the suction transfer device transfers the wafer from a chuck table to a cleaning stage. A holding surface of a suction disc in the suction transfer device is composed of a porous member having substantially the same diameter as the wafer, so that the entire surface of the wafer can be held on the holding surface of the suction disc.

1 Claim, 6 Drawing Sheets

WAFER SURFACE MACHINING APPARATUS

CROSS REFERENCE TO RELATED APPLICATION

This application is a Division of prior application Ser. No. 09/298,998, filed Apr. 26, 1999 now U.S. Pat. No. 6,257,966.

BACKGROUND OF THE INVENTION

1. Field of the Invention

The present invention relates generally to a wafer surface machining apparatus, and more particularly to a wafer surface machining apparatus for grinding the reverse surface of a semiconductor wafer in a semiconductor wafer manufacturing process.

2. Description of Related Art

A surface machining apparatus for grinding the reverse surface of a semiconductor wafer generally comprises a housing stage for containing the wafers, a grinding stage for grinding the wafers, and a suction transfer device for transferring the wafers between the housing stage and the grinding stage. The conventional suction transfer device has a plurality of suction pads on a holding surface of a suction disc, and holds the wafers on the suction pads by suction.

Recently, there has been a desire for thin semiconductor wafers as ICs have become increasingly integrated. For this reason, the surface machining apparatus grinds the wafer thin.

The surface machining apparatus is provided with a chuck table, a grindstone, and a reverse surface cleaning device. The obverse surface of the semiconductor wafer is held on the chuck table and the grindstone is pressed against the reverse surface of the semiconductor wafer. The chuck table and the grindstone are rotated to grind the reverse surface of the wafer. On completion of the grinding, the wafer is removed from the chuck table, and then the reverse surface cleaning device cleans the reverse surface of the wafer.

An example of the reverse surface cleaning device is a spin cleaner. A chuck table of the spin cleaner holds the obverse surface of the wafer, and the chuck table is rotated while cleaning water is supplied to the reverse surface of the wafer to eliminate the sludge, etc. adhered to the reverse surface of the wafer.

Since microchips have been formed on the obverse surface of the wafer in a pretreatment, a protection film is attached on the obverse surface of the wafer in order to protect the microchips. The surface grinding apparatus grinds and cleans the wafer with the protection film attached thereon, and thereafter, the wafer is transferred to a protection film separation stage. For example, an adhesive tape is stuck on the protection film, and the protection film as well as the tape is peeled from the wafer.

Grinding the wafer thin decreases the strength of the wafer. In the case of the conventional suction disc that holds the wafer thereon with a plurality of suction pads, the peripheral part of the wafer easily chips or breaks during the transfer. Likewise, the wafer is damaged while the protection film is peeled from the wafer at the protection film separation stage.

SUMMARY OF THE INVENTION

In view of the foregoing, it is an object of the present invention to provide a wafer surface machining apparatus that has a suction transfer device capable of transferring the thin wafers without damaging them, and that prevents the wafers from being damaged at the protection film separation stage.

To achieve the above-mentioned object, the present invention is directed to a wafer surface machining apparatus comprising: a storage part for storing a wafer; a machining part for machining the wafer; and a suction transfer device for transferring the wafer between the storage part and the machining part, the suction transfer device holding the wafer on a suction disc having a holding surface composed of a porous member of substantially the same diameter as the wafer.

According to the present invention, the suction disc of the suction transfer device, which transfers the wafer between the storage part and the machining part, has the holding surface made of the porous member having substantially the same diameter as the wafer to thereby hold the entire surface of the wafer thereon. This prevents the thin wafer from chipping and breaking during the transfer.

To achieve the above-mentioned object, the present invention is directed to a wafer surface machining apparatus comprising: a table for holding a wafer; a machining member for machining the wafer; a driving part for moving the machining member and the table in such a direction as to become closer to one another to press the machining member against the wafer and rotating the machining member and the wafer relatively to one another to machine a first surface of the wafer; a first cleaning device for cleaning the first surface of the wafer after machining of the first surface; and a second cleaning device for cleaning a second surface of the wafer after the machining of the first surface, the second surface being opposed to the first surface.

It is understood that the sludge adhered to the protection film causes damage to the wafer during the protection film separation process. More specifically, if the sludge is adhered to the protection film, the adhesive tape cannot be stuck on the sludge adhering area completely. When the incomplete stuck tape is peeled from the wafer, the peeling force cannot uniformly be transmitted to the protection film. In this case, the peeling force may center on a part of the protection film, and the centered force damages the wafer. In particular, the sludge adhered to the outer peripheral part of the protection film causes damage.

To address this problem, the second cleaning device is provided to clean the protection film on the second surface or the obverse surface of the wafer to thereby eliminate the sludge from the protection film.

According to the present invention, the brush is employed in the second cleaning device. It is therefore possible to scrape the sludge from the protection film.

According to the present invention, the wafer after the surface machining is held on the suction disc of substantially the same diameter as the wafer. The transfer device transfers the wafer held on the suction disc to the second cleaning device. Since the entire surface is held on the suction disc, it is possible to transfer the wafer without damaging it and to uniformly clean the entire surface of the wafer, which is uniformly pressed against the second cleaning device. On the other hand, if the wafer is partially held on the conventional suction pads, the weight of the wafer is centered on the wafer holding sections on the suction pads. Therefore, the extremely thin wafer may be damaged during the transfer. Moreover, if the wafer is pressed against the cleaning means while the wafer is partially held on the conventional suction pads, there is a strong possibility that the wafer will be damaged during the cleaning. For this reason, it is much more effective to hold the wafer on the suction disc, which has substantially the same diameter as the wafer, in order to prevent the wafer from being damaged.

According to the present invention, the suction transfer device is supported by a supporting part on a body of the wafer surface machining apparatus, the supporting part having rigidity to withstand a reaction force generated when the second surface of the wafer is pressed against the second cleaning device. Thus, the entire second surface of the wafer is uniformly pressed against the brush, so that the entire second surface of the wafer can be cleaned uniformly. On the other hand, if the supporting part for the transfer means is conventionally provided with a cushioning means that cushions the pressing force against the wafer, the wafer cannot sufficiently be pressed against the brush and thus the wafer cannot be cleaned uniformly. For this reason, the rigidity of the supporting part is significantly effective for cleaning the surface of the wafer uniformly.

According to the present invention, the brush is a roller longer than the diameter of the wafer, and the brush is rotated about an axis of the roller and an axis perpendicular to the axis of the roller. It is therefore possible to clean the entire second surface of the wafer without rotating the wafer.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENT

This invention will be described in further detail by way of example with reference to the accompanying drawings.

Figure 1:
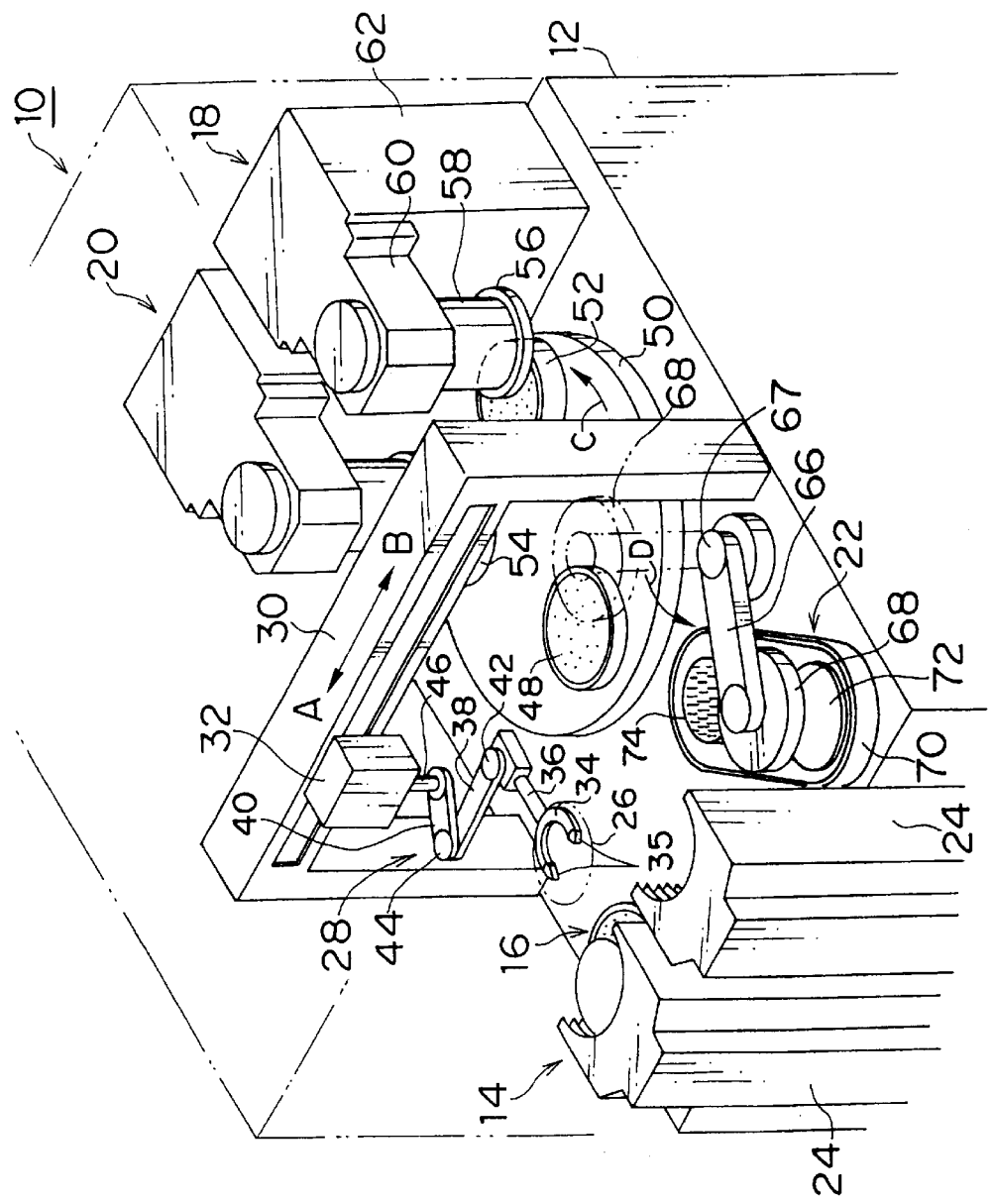
FIG. 1 is a perspective view illustrating the entire structure of a surface machining apparatus for semiconductor wafers according to preferred embodiments of the present invention.
Figure 2:
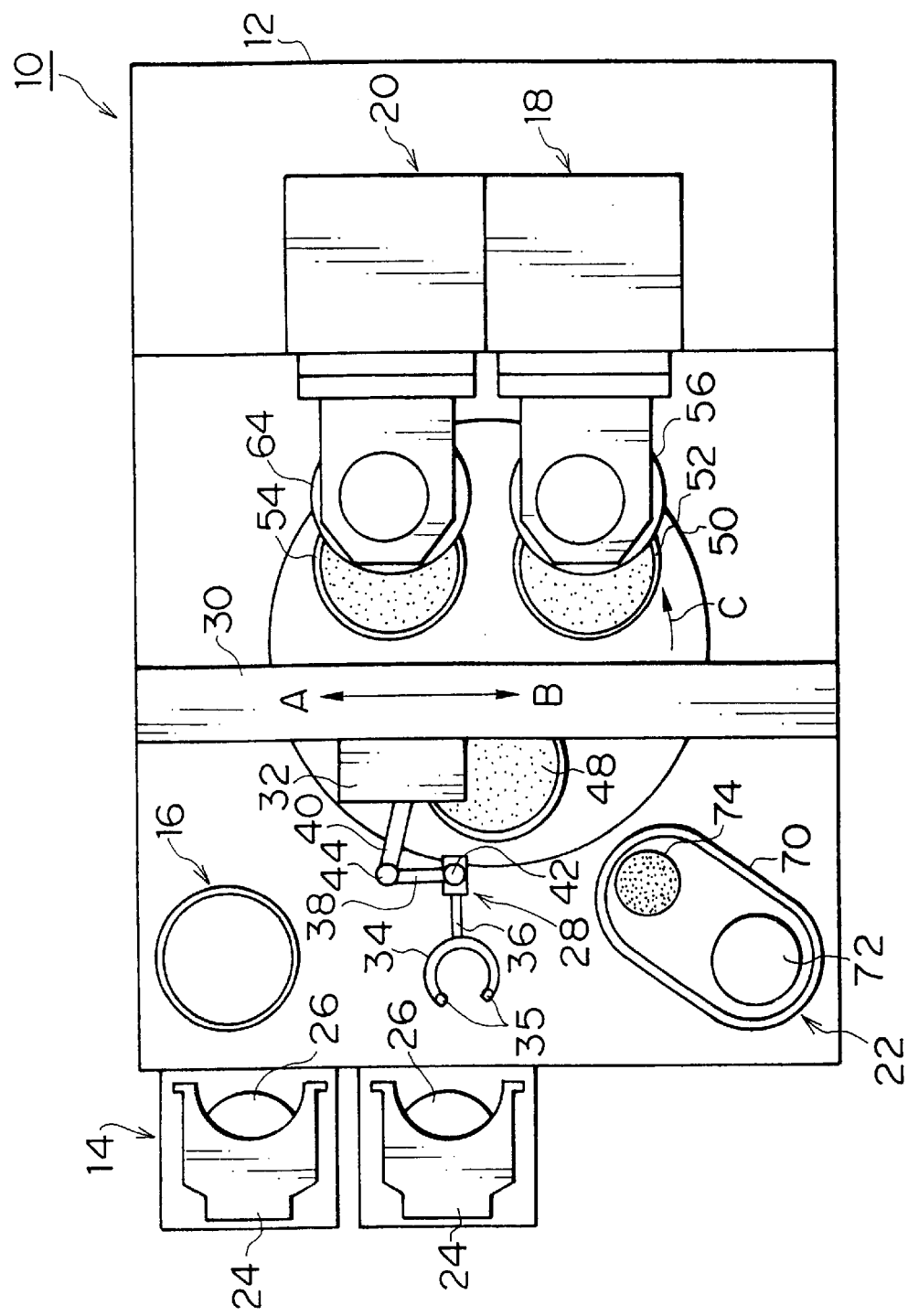
FIG. 2 is a plan view of the surface machining apparatus in FIG. 1.

FIG. 1 is a perspective view showing a surface machining apparatus for grinding semiconductor wafers according to an embodiment of the present invention, and FIG. 2 is a plan view thereof.

As shown in FIG. 1, a cassette housing stage 14, an alignment stage 16, a rough grinding stage 18, a finish grinding stage 20 and a cleaning stage 22 are arranged on a body 12 of the surface machining apparatus 10.

Two cassettes 24 are detachably mounted in the cassette housing stage 14. A number of wafers 26 are stored in the cassettes 24 before their reverse surfaces are ground. A transfer robot 28 captures the wafers 26 one by one and sequentially transfers them to the alignment stage 16. The transfer robot 28 is supported on a beam 30, which stands on the body 12, through a lifting unit 32. The lifting unit 32 connects to a feed screw (not shown), which is built in the beam 30. When the feed screw feeds the lifting unit 32, the transfer robot 28 reciprocates in directions indicted by arrows A and B in FIGS. 1 and 2 along the beam 30. The transfer robot 28 sequentially transfers the wafers 26 on a predetermined route within the surface machining apparatus 10.

Since the transfer robot 28 is supported on the beam 30, there is only a short distance between the cassette 14 and the alignment stage 16. This reduces the size of the surface machining apparatus 10. If the transfer robot 28 is placed at the top of the body 12, the transfer robot 28 must be disposed in a space between the cassette housing stage 14 and the alignment stage 16 to transfer the wafers 26. This increases the size of the surface machining apparatus 10. This embodiment alleviates such a problem by mounting and moving the transfer robot 28 in the space above the body 12, and this reduces the size of the surface machining apparatus 10.

The transfer robot 28 is a general industrial robot, which comprises a U-shaped arm 34 and three links 36, 38 & 40. Suction pads 35 for holding the wafer 26 are attached to both ends of the arm 34. The transfer robot 28 generates sucking force at the suction pads 35 by drawing air through the suction pads 35. The arm 34 is rotatably supported by the link 36, and a motor (not shown) rotates the arm 34 about the axis of the link 36. The link 36 rotatably connects to the link 38 through a shaft 42, and a motor (not shown) rotates the link 36 about the shaft 42. The link 38 rotatably connects to the link 40 through a shaft 44, and a motor (not shown) rotates the link 38 about the shaft 44. The link 40 also connects to an output shaft of a motor (not shown) through a shaft 46. Running the motor rotates the link 40 about the shaft 46. The motor connects to a lifting rod (not shown) of the lifting unit 32. By controlling the arm 34 and the three links 36, 38 & 40 with the motors and controlling the contraction of the lifting rod of the lifting unit 32, the robot 28 can hold the wafer on the suction pads 35 and take out the wafer 26 from the cassette 24. The robot 28 transfers the wafer 26 to the alignment stage 16.

At the alignment stage 16, the wafer 26 transferred from the cassette 24 is aligned to a predetermined position. The aligned wafer 26 is held on the suction pads 35 of the transfer robot 28. Then, the wafer 26 is transferred to a chuck table 48, and it is held at a preset position on the chuck table 48.

The chuck table 48 is placed on a turn table 50, and chuck tables 52 & 54 having the same function as the chuck table 48 are placed at a predetermined interval on the turn table 50. The chuck table 52 is located at the rough grinding stage 18, and the wafer 26 held on the chuck table 52 is roughly ground. The chuck table 54 is located at the finish grinding stage 20, and the wafer 26 held on the chuck table 54 is finish-ground (undergoes precision grinding and spark-out grinding). Although not shown in FIGS. 1 and 2, the bottoms of the chuck tables 48, 52 & 54 connect to spindles of motors. The motors rotate the chuck tables 48, 52 & 54.

A gage (not shown) measures the thickness of the wafer 26 held on the chuck table 48. The measured wafer 26 is shifted to the rough grinding stage 18 due to the turn of the turn table 50 in a direction of an arrow C in FIGS. 1 and 2. At the rough grinding stage 18, a cup-shaped grindstone 56 roughly grinds the reverse surface of the wafer 26. As shown in FIG. 1, the cup-shaped grindstone 56 connects to an output shaft (not shown) of a motor 58, and is attached to a grindstone feeding unit 62 through a support casing 60 of the motor 58. The grindstone feeding unit 62 moves the cup-shaped grindstone 56 with the motor 58 up and down, and the downward movement presses the cup-shaped grindstone 56 against the reverse surface of the wafer 26. Consequently, the reverse surface of the wafer 26 is roughly ground. The downward moving amount of the cup-shaped grindstone 56, in other words, the thickness of the material removed by the cup-shaped grindstone 56 is determined according to a previously-registered reference position of the cup-shaped grindstone 56 and the thickness of the wafer 26.

After the cup-shaped grindstone 56 moves away from the wafer 26, the gage (not shown) measures the thickness of the wafer 26, whose reverse surface has been ground roughly at the rough grinding stage 18. The measured wafer 26 is shifted to the finish grinding stage 20 due to the turn of the turn table 50 in the direction of the arrow C. At the finish grinding stage 20, a cup-shaped grindstone 64 in FIG. 2 performs the precision grinding and the spark-out grinding for the wafer 26. The structure of the finish grinding stage 20 will not be described here since it has substantially the same structure as the rough grinding stage 18.

On completion of the finish grinding at the finish grinding stage 20, the cup-shaped grindstone 64 moves away from the wafer 26, and the wafer 26 is transferred to the position of the chuck table 48 in FIG. 1 due to the turn of the turn table 50 in the direction of the arrow C. The wafer 26 is held on a suction disc 68 provided at the end of a moving part or a transfer arm 66. The suction disc 68 has a disc-shaped porous suction surface 68A, which has substantially the same diameter as the wafer 26. Then, the wafer 26 is transferred to the cleaning stage 22 due to the turn of the transfer arm 66 in the direction of an arrow D in FIG. 1.

Figure 3:
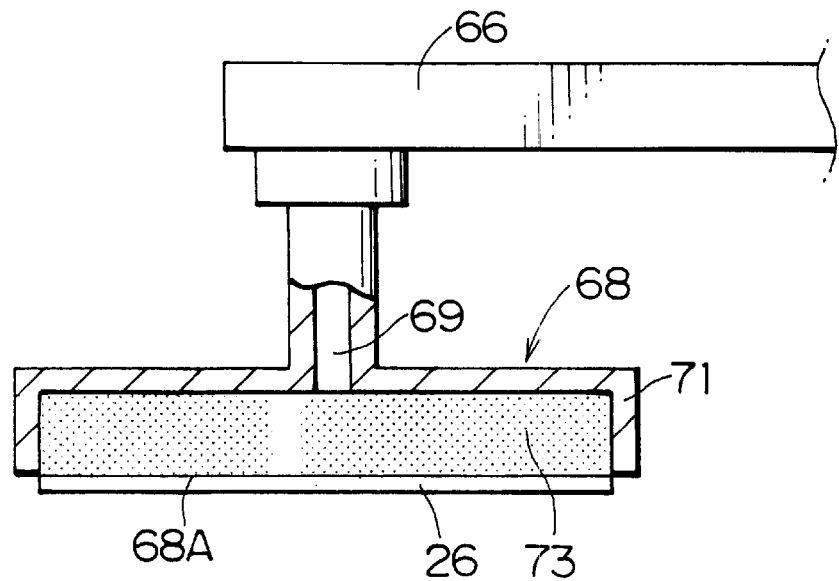
FIG. 3 is a sectional view of assistance in explaining a suction disc according to the first embodiment.
Figure 4:
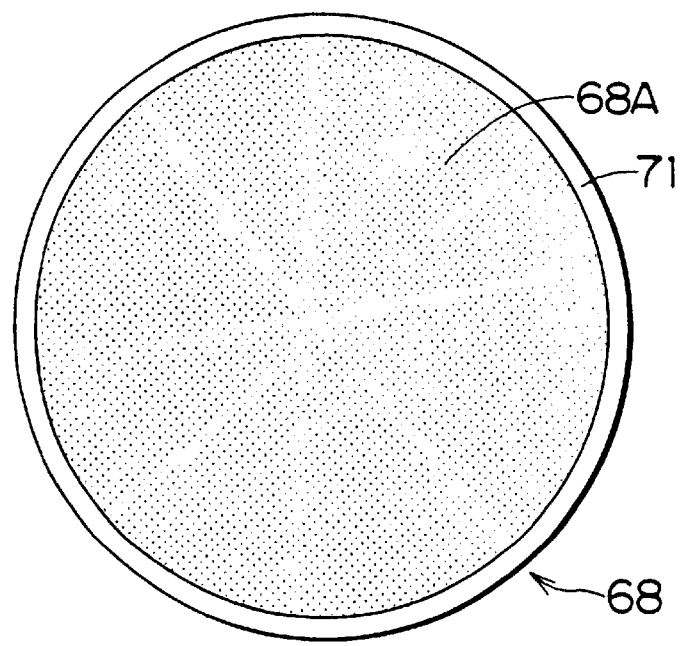
FIG. 4 is a bottom view of the suction disc in FIG. 3.

FIG. 3 is a sectional view showing the first embodiment of the suction disc 68 provided at the end of the transfer arm 66, and FIG. 4 is a bottom view showing the suction disc 68.

As shown in FIGS. 3 and 4, the suction disc 68 is constructed in such a way that a disc-shaped porous body 73 of substantially the same diameter as the wafer 26 is fitted in a reverse cup-shaped frame 71, in which a suction pipe 69 is formed. The suction pipe 69 connects to a suction device (not shown) through a suction route formed in the transfer arm 66. The operation of the suction device causes the suction surface 68A of the suction disc 68, which is formed by the porous body 73, to generate sucking force. Consequently, the entire surface of the wafer 26 can be held on the suction surface 68A. The porous body 73, for example, is made of porous ceramic, sintered metal or porous resin. The porous body 73 is not necessarily fitted in the frame 71, but the suction surface 68A of the suction disc 68 must be formed by the porous body 73.

As stated above, the thin wafer 26 after the rough grinding and the finish grinding is held on the suction disc 68 with the suction surface 68A, which is formed by the disc-shaped porous body 73 of substantially the same diameter as the wafer 26. Consequently, the entire surface of the wafer 26 can be held on the suction surface 68A as if the entire surface of the wafer 26 were united with the entire suction surface 68A of the suction disc 68. Thus, the suction surface 68A serves as a stiffening plate for the wafer 26. This prevents the peripheral edge of the wafer 26 from chipping or breaking when the thin wafer 26 is held or transported.

The wafer 26 is cleaned at the cleaning stage 22, and it is stored on a predetermined shelf of the predetermined cassette 24. This completes the wafer processing procedure of the surface machining apparatus 10 according to the present invention.

In this embodiment, only the transfer arm 66 for transferring the ground wafer 26 is provided with the suction disc 68, which has the suction surface 68A formed by the porous body 73 of substantially the same diameter as the wafer 26, but it is preferable to also provide the transfer robot 28 with the same suction disc as the suction disc 68.

Figure 5:
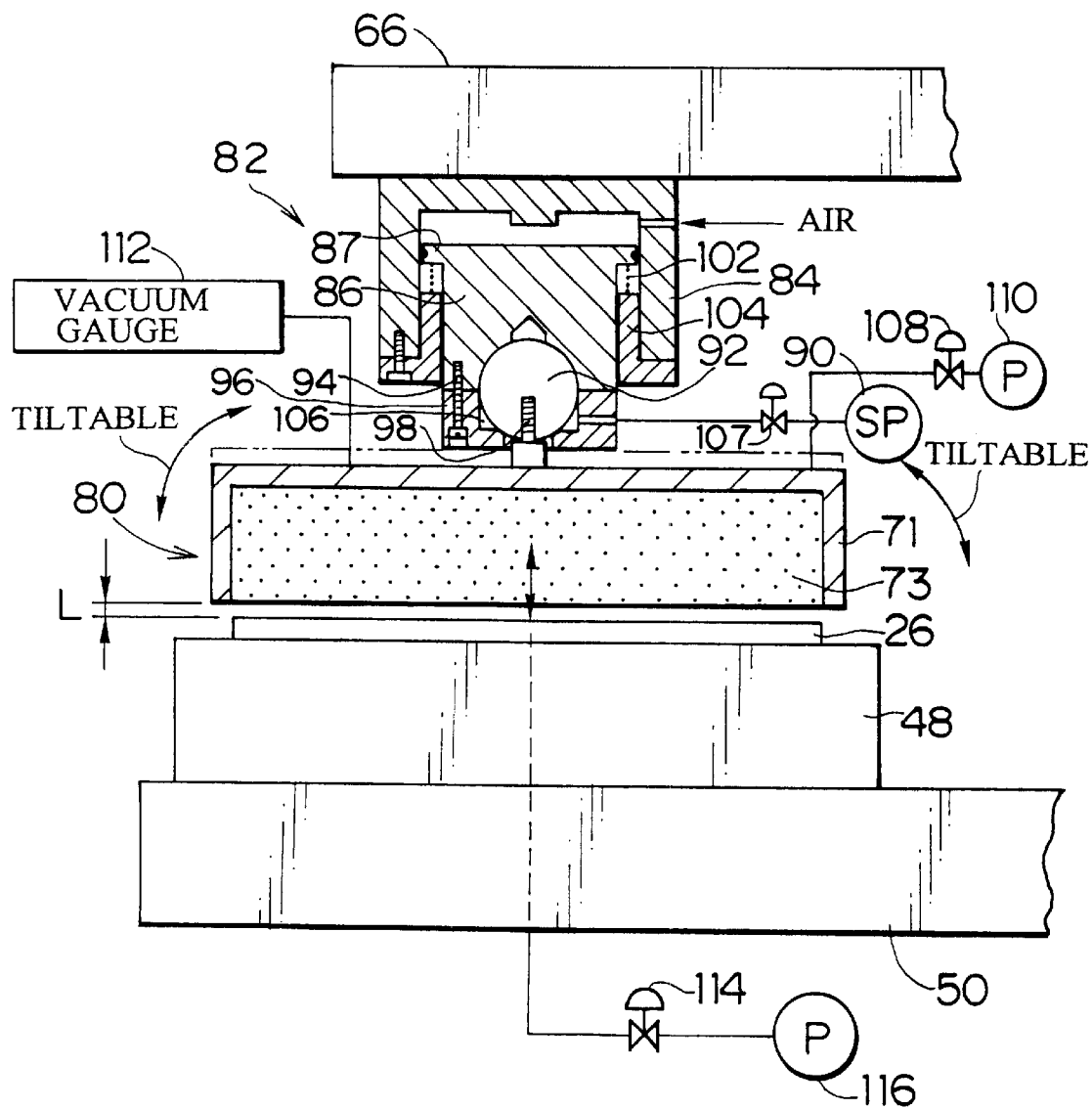
FIG. 5 is a sectional view of assistance in explaining a suction disc according to the second embodiment.

FIG. 5 is a sectional view showing a suction disc 80 according to the second embodiment. Parts similar to those of the suction disc 68 according to the first embodiment described with reference to FIG. 3 are denoted by the same reference numerals, and they will not be described.

In FIG. 5, the suction disc 80 connects to the transfer arm 66 through a joint or an air cylinder 82. The air cylinder 82 comprises a cylinder case 84, a rod 86 and a suction pump 90.

The cylinder case 84 is fixed to the transfer arm 66, and the rod 86 is supported by the cylinder case 84 so that the rod 86 can move vertically. The suction disc 80 is attached to the rod 86 across a ball 92. The ball 92 is rotatably supported between the rod 86 and a supporting member 96, which is fixed to the bottom of the rod 86 through a screw 94 and is made of hard rubber. Thus, the suction disc 80, which is fixed to the ball 92 through a screw 98, is capable of tilting with respect to the transfer arm 66 in conformity with the inclination of the surface of the wafer 26 held on the chuck table 48. This enables the entire surface of the wafer 26 to be uniformly held on the suction disc 80. A sleeve 104 is inserted in the cylinder case 84, and a spring 102 is arranged between the sleeve 104 and a top flange 87 of the rod 86. The spring 102 presses the rod 86 upwardly.

Running the suction pump 90 draws air from a ball housing chamber 106 enclosed by the rod 86 and the supporting member 96. The negative pressure resulting from the drawing deforms the supporting member 96 elastically in such a direction as to reduce the space in the ball housing chamber 106. This causes the ball 92 to be fixed between the rod 86 and the supporting member 96, so that the ball 92 can not rotate. Opening a vacuum breaker 107 returns the pressure in the ball housing chamber 106 to the atmospheric pressure. Therefore, the support member 96 returns to the original form, the ball 92 becomes capable of rotating, and the suction disc 80 becomes capable of tilting again.

The suction disc 80 connects to a suction pump 110 through a vacuum breaker 108. Closing the vacuum breaker 108 and running the suction pump 110 drives the suction disc 80 in vacuum. The suction disc 80 connects to a vacuum gauge 112, which measures the pressure of the suction disc 80.

The chuck table 48 connects to a suction pump 116 through a vacuum breaker 114. Opening the vacuum breaker 114 stops the suction of the chuck table 48 for the wafer 26. The chuck tables 52 & 54 are constructed in the same manner as the chuck table 48.

The suction disc 80 of the second embodiment has been developed to eliminate the disadvantages as described below.

In a conventional method for removing the wafer from the chuck table and holding the wafer on the suction disc, after the suction of the chuck table is stopped, a liquid, gas or bubble is supplied from the suction surface of the chuck table to blow up the wafer. Then, the lifted wafer is held on the suction pad. In the conventional method, however, the extremely thin wafer is damaged due to the pressure, which is generated when the wafer is blown up, or the wafer is out of position on the suction disc.

Moreover, if the suction disc is fixed to the transfer arm in a state where the suction disc is incapable of tilting, the sucking force of the suction disc for the wafer is reduced. Thus, the wafer may be left on the chuck table.

Furthermore, if the wafer is held on the suction disc and the transfer arm is turned without lifting the wafer from the chuck table, the obverse of the wafer facing downward is rubbed against the chuck table. This may damage the obverse, where the microchips are formed, of the wafer. If the wafer is attempted to remove from the chuck table without taking into consideration an influence of the surface tension of the liquid between the chuck table and the wafer, the wafer is sometimes left on the chuck table since the surface tension operates to draw the wafer onto the chuck table.

A description will now be given of the operation of the suction disc 80 according to the second embodiment for eliminating the above-mentioned disadvantages.

As shown in FIG. 5, the transfer arm 66 positions the suction disc 80 above the wafer 26 held on the chuck table 48. At this time, the vacuum breaker 107 is open, and thus, the ball 92 is rotatable and the suction disc 80 is tiltable with respect to the transfer arm 66. The distance L between the suction disc 80 and the wafer 26 is determined so that the suction disc 80 can move to the wafer 26 with its sucking force. The distance L is also determined in such a way that the influence of the surface tension of the liquid between the chuck table 48 and the wafer 26 does not reach the maximum (i.e., the liquid is kept from splitting) when the suction disc 80 removes the wafer 26 from the chuck table 48.

Then, the vacuum breaker 108 is closed, and the suction pump 110 is run. This causes the suction disc 80 to move down to the wafer 26 against the force of the spring 102 with its sucking force to hold the wafer 26 thereon. At this time, the suction disc 80 can tilt freely with respect to the transfer arm 66. The suction disc 80 tilts in conformity with the surface of the wafer 26 so as to hold the entire surface of the wafer 26.

If the vacuum gauge 112 detects that the pressure in the suction disc 80 has reached an optimum value, it means that the suction disc 80 holds the wafer 26 steadily. Then, the vacuum breaker 107 is closed and the suction pump 90 is run. This causes the ball 92 to be fixed between the rod 86 and the supporting member 96 so that the ball 92 can not rotate. Thus, the suction disc 80 is fixed to the transfer arm 66 in such a way that the suction disc 80 does not tilt any further.

Then, the vacuum breaker 114 is opened to cancel the suction of the wafer 26 on the chuck table 48 for the wafer 26. Consequently, the force of the spring 102 moves up the rod 86, and the suction disc 80 moves up to the original position.

At this time, the suction disc 80 is located in such a way that the surface tension of the liquid between the chuck table 48 does not reach the maximum and the liquid is kept from splitting. This prevents the wafer 26 from being left on the chuck table 48.

Then, the transfer arm 66 is moved horizontally to transfer the wafer 26, which is held on the suction disc 80, to the cleaning stage 22. Since the wafer 26 is moved away from the chuck table 48 in advance, the obverse surface (where the microchips are formed) of the wafer 26 is not rubbed against the chuck table 48. Thus, the obverse surface of the wafer 26 will not be damaged by the chuck table 48.

For the reasons stated above, the use of the suction disc 80 in the second embodiment eliminates the disadvantages in the conventional method.

A description will now be given of the cleaning stage 22.

As shown in FIGS. 1 and 2, a spin cleaner 72 as the first cleaning device is disposed in a sink 70, and a brush scrubber 74 as the second cleaning device is disposed between the spin cleaner 72 and the turn table 50.

Figure 6:
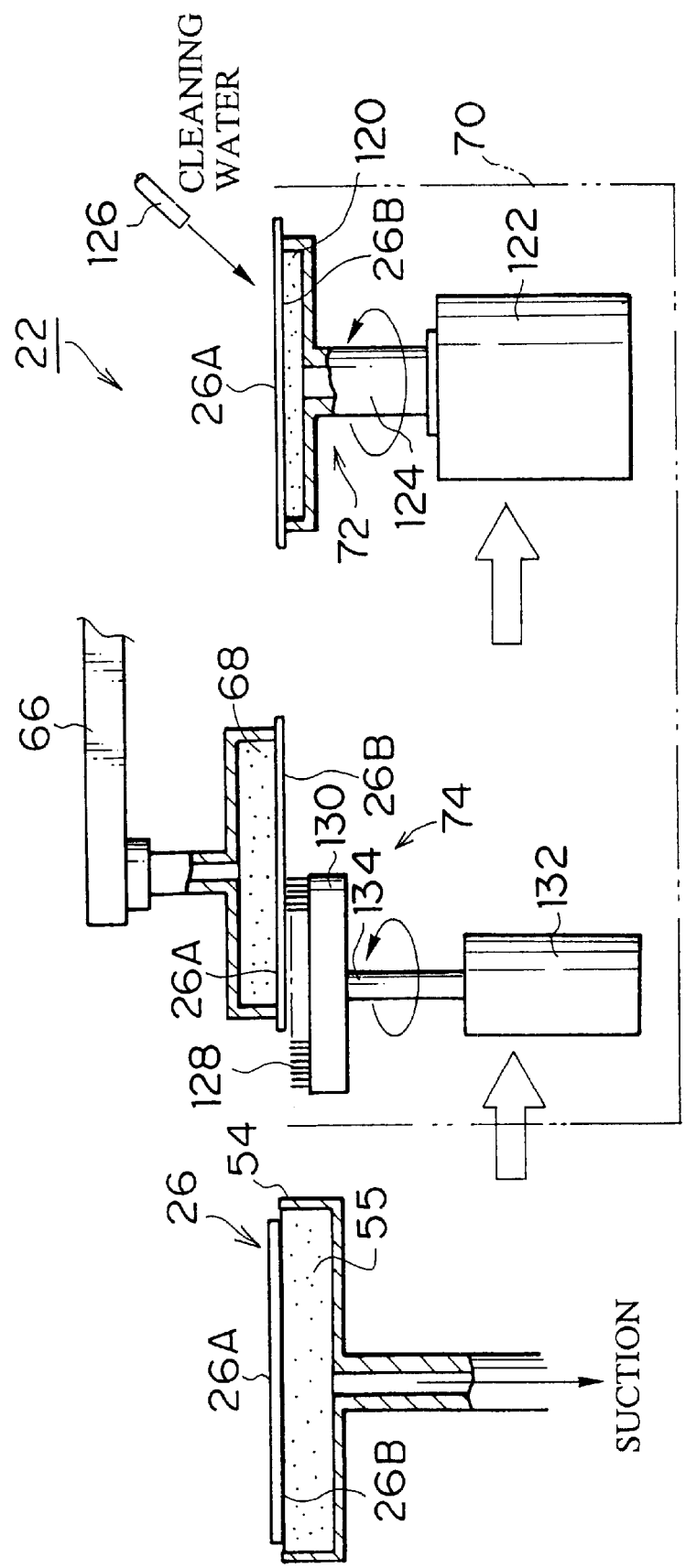
FIG. 6 is an explanation drawing showing a cleaning process of a wafer protection film cleaning device according to the first embodiment.

As shown in FIG. 6, the spin cleaner 72 has a suction pad 120 of substantially the same diameter as the wafer 26. A spindle 124 of a motor 122 connects to the reverse surface of the suction pad 120. A nozzle 126 is provided above the suction pad 120, and cleaning water is supplied through the nozzle 126. The spin cleaner 72 jets the cleaning water against the reverse surface 26A of the wafer 26 through the nozzle 126 while rotating the wafer 26 held on the suction pad 120. This eliminates the sludge, etc. adhered to the reverse surface 26A of the wafer 26.

The brush scrubber 74 has a disc-shaped plate 130 with a brush 128, and a spindle 134 of a motor 132 connects to the reverse surface of the plate 130. The brush scrubber 74 presses the obverse surface 26B of the wafer 26 held on the suction pad 68 of the transfer arm 66 against the brush 128 while rotating the brush 128 with the motor 132. This scrapes the sludge, etc. adhered to a protection film covering the obverse surface 26B of the wafer 26.

To press the wafer 26 against the brush 128, the brush scrubber 74 may be raised or the transfer arm 66 may be lowered. A supporting part 67 (see FIG. 1) of the transfer arm 66 must have a predetermined rigidity so that the supporting part 67 can withstand a reaction force when the wafer 26 is pressed against the brush 128. Since the supporting part 67 is sufficiently rigid and the reverse surface 26A of the wafer 26 is entirely held on the suction pad 68, the obverse surface 26B of the wafer 26 is uniformly pressed against the brush 128. Thus, the obverse surface 26B of the wafer 26 is cleaned uniformly.

To clean the entire protection film of the wafer 26, the suction pad 68 may be rotated, or the brush scrubber 74 or the suction pad 68 may be swung horizontally. Although the microchips on the wafer 26 are protected by the protection film, they are not so resistant to the shocks. For this reason, pressing the protection film strongly with the brush 128 may damage the microchips. To address this problem, the pressing force of the brush 128 is preferably as small as possible and the brush 128 is preferably made of soft and sturdy material.

A description will now be given of the operation of the cleaning stage 22.

As shown in FIG. 6, the wafer 26 after the final grinding is held on the chuck table 54 with its reverse surface 26A facing upward. The protection film on the obverse surface 26B of the wafer 26 is held on the suction pad 55.

Then, the reverse surface 26A of the wafer 26 is held on the suction pad 68. After the wafer 26 is removed from the chuck table 54, the transfer arm 66 is turned to transfer the wafer 26 to the cleaning stage 22. Since the entire surface of the wafer 26 is held on the suction pad 68, the wafer 26 will not be damaged during the transfer and cleaning.

At the cleaning stage 22, the protection film on the obverse surface 26B of the wafer 26 held on the suction pad 68 is pressed against the brush 128 of the brush scrubber 74 by a predetermined force. Then, the brush 128 is rotated, and the brush 128 and the wafer 26 are swung horizontally with respect to each other. This brings the brush 128 into contact with the entire surface of the protection film, and it is therefore possible to scrape the sludge, etc. from the protection film.

After the cleaning of the protection film, the transfer arm 66 is turned to transfer the wafer 26 to the spin cleaner 72. Then, the protection film on the wafer 26 is held on the suction pad 120 of the spin cleaner 72. The motor 122 rotates the wafer 126, and the cleaning water is jetted to the reverse surface 26A of the wafer 26 through the nozzle 26 to clean the reverse surface 26A of the wafer 26. After a predetermined period, the spin cleaner 72 is stopped, and the cleaning is completed. At the cleaning stage 22, both surfaces of the wafer 26 are cleaned and then dried.

As stated above, the surface machining apparatus 10 of this embodiment is provided with the brush scrubber 74 for cleaning the protection film, and the brush scrubber 74 eliminates the sludge adhered to the protection film. This prevents the wafer from being damaged during the separation of the protection film. Moreover, in this embodiment, the brush scrubber 74 is used to clean the protection film, and thus, it is possible to scrape the sludge from the protection film steadily.

Figure 7:
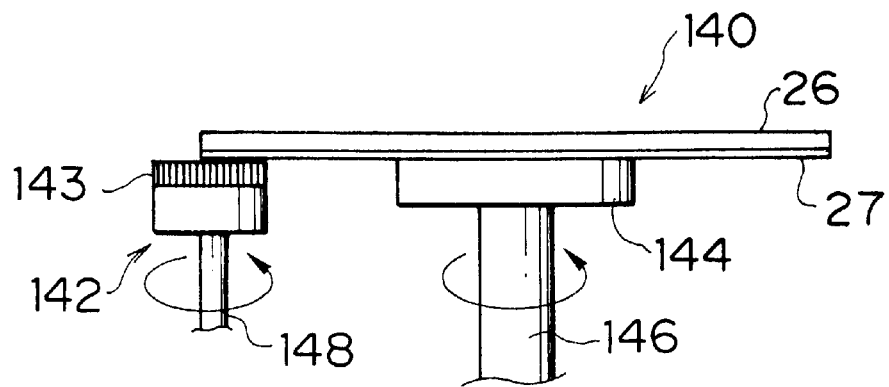
FIG. 7 is a side view showing the second embodiment of the wafer protection film cleaning device.

FIG. 7 is a side view showing the essential parts of the second embodiment of the protection film cleaning device.

A cleaning device 140 in FIG. 7 is a brush scrubber as is the case with the cleaning device in FIG. 6. Since the wafer 26 is damaged during the separation of the protection film mainly by the sludge adhered to the outer periphery of the protection film 27, the cleaning device 140 eliminates the sludge adhered to the outer periphery of the protection film 27 with a small brush scrubber 142. The cleaning device 140 has a suction pad 144, which holds the center of the protection film 27. A spindle 146 rotates the suction pad 144. The brush scrubber 142 also has a spindle 148, which rotates a brush 143.

According to the cleaning device 140, the spindle 146 rotates the wafer 26 while the spindle 148 rotates the brush 143, which is pressed against the outer periphery of the protection film 27. Consequently, the sludge is scraped from the outer periphery of the protection film 27.

Figure 8:
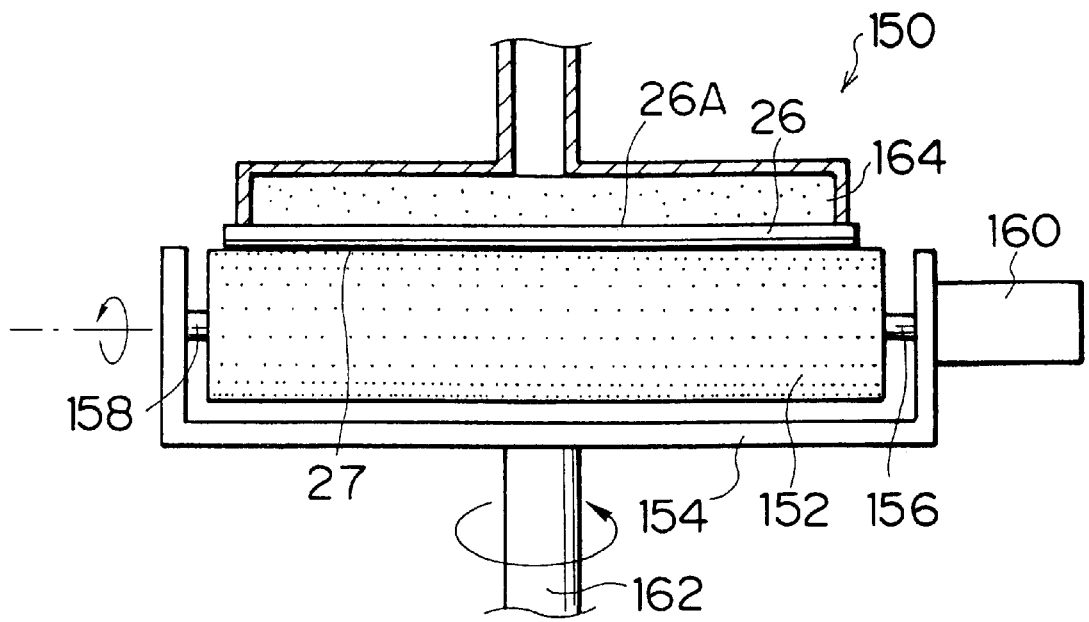
FIG. 8 is a side view showing the third embodiment of the wafer protection film cleaning device.

FIG. 8 is a sectional view showing the essential parts of the third embodiment of the protection film cleaning device.

A cleaning device 150 in FIG. 8 eliminates the sludge adhered to the protection film 27 by a roller-shaped brush 152 that is longer than the diameter of the wafer 26. Shafts 156 & 158 project horizontally from both ends of the brush 152, and the shafts 156 & 158 are pivotally supported on a frame 154. Thus, the brush 152 is rotatably supported in the frame 154. A spindle (not shown) of a motor 160 connects to the shaft 156, and running the motor 160 causes the brush 152 to rotate on the shafts 156 & 158. A vertical spindle 162 connects to the bottom of the frame 154. The rotation of the spindle 162 revolves the brush 152 on the axis of the spindle 162. On the other hand, the reverse surface 26A of the wafer 26 is held on a suction pad 164 of substantially the same diameter as the wafer 26.

Thus, the cleaning device 150 rotates the brush 152 by the motor 160 and revolves the brush 152 by the spindle 162. The protection film 27 is pressed against the rotating and revolving brush 162. It is therefore possible to scrape the sludge adhered to the entire surface of the protection film 27 by the brush 152 without rotating the wafer 26.

In this embodiment, each of the brush scrubbers 74, 140 & 150 is used as the second cleaning device for cleaning the protection film, but the present invention should not be restricted to this. For example, it is possible to use another cleaning device such as a spray cleaner, which cleans the protection film by supplying high-pressure water to the protection film, and a cleaning device that cleans the protection film by rubbing a soft member such as a sponge against the protection film.

In the above-described embodiments, the present invention is applied to the surface machining apparatus, which grinds the reverse surface of the wafer. The present invention, however, may also be applied to a chemical-mechanical polishing (CMP) apparatus, which machines the wafer by an polishing pad instead of the cup-shaped grindstone, and a dicing apparatus, which dices the wafer by a blade instead of the cup-shaped grindstone.

As set forth hereinabove, according to the surface machining apparatus of the present invention, the holding surface of the suction disc of the suction transfer device, which transfers the wafer between the housing part and the machining part, is made of the porous member of substantially the same diameter with the wafer, so that the entire surface of the wafer can be held on the holding surface of the suction disc.

Therefore, it seems as if the wafer were united with the suction disc. This prevents the thin wafer from being cracked or chipped at the peripheral edge during the transfer, and reduces the machining loss.

Moreover, the surface machining apparatus for the wafer according to the present invention is provided with the cleaning device for cleaning the protection film of the wafer. This prevents the wafer from being damaged during the separation of the protection film. The brush cleaning device is used as the cleaning device for cleaning the protection film, and it is therefore possible to steadily eliminate the sludge adhered to the protection film.

Furthermore, the extremely thin wafer after the surface machining is held on the suction pad of substantially the same diameter as the wafer, and is transferred to the second cleaning device. This prevents the wafer from being damaged during the transfer and cleaning.

In addition, the supporting part for supporting the transfer device on the surface machining apparatus has sufficient rigidity to withstand the reaction force, which is generated when the wafer is pressed against the brush of the second cleaning device. Thus, the entire obverse surface of the wafer can be cleaned uniformly.

Further, the brush of the brush cleaning device is shaped like the roller, which is longer than the diameter of the wafer, and the brush is rotated about the axis of the roller and the axis perpendicular to the axis of the roller. It is therefore possible to clean the entire obverse surface of the wafer without rotating the water.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A wafer surface machining apparatus comprising:
   a table for holding a first surface of a wafer by suction;
   a machining part for machining a second surface of the wafer held on the table, the second surface being opposed to the first surface; and
   a suction transfer device for transferring the wafer from the table to a predetermined stage, the suction transfer device being adapted to hold via suction the second surface of the wafer being held by suction on the table;

wherein the suction transfer device comprises:
an upwardly biased suction transfer disc having a holding surface composed of a porous member of substantially the same diameter as the wafer;
a moving part for reciprocating the suction disc between the table and the predetermined stage; and
a supporting part comprising a joint provided with a mechanism capable of supporting the suction transfer disc such that the suction transfer disc can move with respect to the moving part
wherein the suction transfer device
positions the suction transfer disc a predetermined distance over the wafer held on the table via the moving part,
causes the suction transfer disc to suck air to move the suction transfer disc downward against the upward bias to the wafer on the table and to thereby hold the wafer on the suction transfer disc,
halts the suction of the table to thereby release the wafer from the table to thereby hold the wafer only on the suction disc, and
moves the wafer via the upward bias of the suction transfer disc from the table by the predetermined distance and transfers the wafer to the predetermined stage.

* * * * *